(12) United States Patent
Hori et al.

(10) Patent No.: US 7,776,808 B2
(45) Date of Patent: Aug. 17, 2010

(54) CLEANING AGENT FOR REMOVING SOLDER FLUX AND METHOD FOR CLEANING SOLDER FLUX

(75) Inventors: Shigeo Hori, Osaka (JP); Hisakazu Takahashi, Shiga (JP); Hirohiko Furui, Shiga (JP); Hiroki Nakatsukasa, Shiga (JP)

(73) Assignee: Kaken Tech Co., Ltd., Osaka (JP)

( * ) Notice: Subject to any disclaimer, the term of this patent is extended or adjusted under 35 U.S.C. 154(b) by 252 days.

(21) Appl. No.: 12/221,660

(22) Filed: Aug. 5, 2008

(65) Prior Publication Data
US 2008/0305979 A1 Dec. 11, 2008

Related U.S. Application Data

(62) Division of application No. 10/560,941, filed as application No. PCT/JP2004/011455 on Aug. 10, 2004, now Pat. No. 7,435,711.

(30) Foreign Application Priority Data
Aug. 27, 2003 (JP) ............................. 2003-302870

(51) Int. Cl.
*C11D 7/50* (2006.01)
(52) U.S. Cl. ..................... 510/175; 510/201; 134/38
(58) Field of Classification Search ................ 510/175, 510/201; 134/38
See application file for complete search history.

(56) References Cited
U.S. PATENT DOCUMENTS
5,411,678 A * 5/1995 Sim .......................... 510/206

5,454,985 A * 10/1995 Harbin .......................... 510/206

(Continued)

FOREIGN PATENT DOCUMENTS
JP 63-69897 3/1988

(Continued)

*Primary Examiner*—Gregory E Webb
(74) *Attorney, Agent, or Firm*—Carmody & Torrance LLP (57) ABSTRACT

The present invention provides a cleaning agent for removing the solder flux and method for cleaning the solder flux which exhibit the excellent cleaning property even at the time of cleaning a lead-free soldering flux, a high-melting-point solder flux or the like and, at the same time, exhibits the excellent rinsing property in the rinsing using an alcoholic solvent in a next step. Accordingly, the present invention provides a cleaning agent for removing the solder flux which sets a content of benzyl alcohol to a value which falls within a range of 70 to 99.9 weight % and a content of amino alcohol to a value which falls within a range of 0.1 to 30 weight % when a content of a glycol compound is below 1 weight % with respect to a total amount of the cleaning agent for removing the solder flux, and sets a content of benzyl alcohol to a value which falls within a range of 15 to 99 weight % and a content of amino alcohol to a value which falls within a range of 0.1 to 30 weight % when a content of the glycol compound falls within a range of 1 to 40 weight % with respect to a total amount of the cleaning agent for removing the solder flux. The cleaning agent for removing the solder flux is used for cleaning the lead-free solder flux and the high-melting-point solder flux or the like.

8 Claims, 4 Drawing Sheets

U.S. PATENT DOCUMENTS

| | | | |
|---|---|---|---|
| 5,487,789 A * | 1/1996 | Sim | 134/38 |
| 5,612,303 A * | 3/1997 | Takayanagi et al. | 510/174 |
| 5,977,042 A * | 11/1999 | Hernandez et al. | 510/201 |
| 6,025,313 A * | 2/2000 | Weir | 510/201 |
| 6,544,942 B1 | 4/2003 | Smith et al. | |
| 7,015,182 B2 * | 3/2006 | Rindo et al. | 510/175 |
| 7,435,711 B2 * | 10/2008 | Hori et al. | 510/175 |
| 7,674,760 B2 * | 3/2010 | Hei et al. | 510/435 |
| 2002/0144718 A1 * | 10/2002 | Wilson | 134/38 |
| 2004/0127375 A1 * | 7/2004 | Foster | 510/201 |
| 2004/0259753 A1 * | 12/2004 | Wilson et al. | 510/421 |
| 2006/0223732 A1 * | 10/2006 | Hori et al. | 510/175 |
| 2007/0087952 A1 * | 4/2007 | Hei et al. | 510/214 |
| 2007/0095003 A1 * | 5/2007 | Hei et al. | 52/741.1 |
| 2007/0272275 A1 * | 11/2007 | Wu et al. | 134/19 |
| 2008/0305979 A1 * | 12/2008 | Hori et al. | 510/178 |
| 2009/0131296 A1 * | 5/2009 | Kriens et al. | 510/207 |
| 2009/0229629 A1 * | 9/2009 | Lee et al. | 134/3 |
| 2010/0029533 A1 * | 2/2010 | Kriens et al. | 510/207 |

FOREIGN PATENT DOCUMENTS

| | | |
|---|---|---|
| JP | 03-140486 | 6/1991 |
| JP | 04-034000 | 2/1992 |
| JP | 05-59397 | 3/1993 |
| JP | 05-175641 | 7/1993 |
| JP | 10-114899 | 5/1998 |
| JP | 2000-008080 | 1/2000 |
| JP | 2000-8096 | 1/2000 |
| JP | 2002-012894 | 1/2002 |

* cited by examiner

CLEANING AGENT FOR REMOVING SOLDER FLUX AND METHOD FOR CLEANING SOLDER FLUX

CROSS REFERENCE TO RELATED APPLICATIONS

This application is a divisional of U.S. application Ser. No. 10/560,941, filed Dec. 15, 2005 now U.S. Pat. No. 7,435,711, which was the National Stage application of International Application No. PCT/JP2004/011455, filed Aug. 10, 2004.

TECHNICAL FIELD

The present invention relates to a cleaning agent for removing the solder flux and a method for cleaning the solder flux, and more particularly to a cleaning agent for removing the solder flux and a cleaning method of the solder flux which are suitable for cleaning a lead-free solder flux, a high-melting-point flux and the like.

BACKGROUND OF THE INVENTION

Conventionally, in an electronic material field, as a cleaning agent for removing the solder flux, a coating film peel-off cleaning agent or the like, a cleaning agent which contains a glycol compound as a main content has been popularly used. On the other hand, a cleaning agent which contains a mono-alcoholic solvent as a main content has been also well known.

For example, there has been disclosed a cleaning agent composite capable of cleaning a non-water-soluble polymer material such as a protective coating film or the like (for example, patent document 1). To be more specific, the patent document 1 has disclosed a method which cleans an acrylic polymer protective coating film which forms an anticorrosive material using a cleaning composite which is constituted of (A) 5 to 95 parts by weight of a particular amine-group, (B) 0.2 to 50 parts by weight of benzyl alcohol or the like and (C) 0.1 to 80 parts by weight of a particular surfactant.

Further, there has been disclosed a cleaning method of an electronic part after soldering which uses a mono-alcoholic solvent having a relatively high flash point as a chlorofluorocarbon substitute cleaning agent (for example, patent document 2). To be more specific, there has been disclosed a cleaning method of a soldered electronic part where the electronic part is immersed into isopropyl alcohol before or after immersing the electronic component in a flux cleaning agent constituted of benzyl alcohol (for example, patent document 2).

Further, there has been disclosed an industrial-use cleaning agent which can be handled safely, can clean various solid pollutants such as the flux and the like and can be rinsed with water (for example, patent document 3) To be more specific, the patent document 3 has disclosed an industrial-use cleaning agent which is constituted of (A) 50 to 70 parts by weight of benzyl alcohol, (B) 20 to 40 parts by weight of particular water-soluble glycol ether and (C) 1 to 20 parts by weight of a particular surfactant and (D) 5 to 20 parts by weight of water.

Further, there has been disclosed a cleaning agent which exhibits the excellent removing property for a rosin-based flux or the like, is hardly degraded and also exhibits the good waste-water disposal property (for example, patent document 4). To be more specific, patent document 4 has disclosed a cleaning agent which is constituted of (A) 70 or more parts by weight of benzyl alcohol or 2-phenyl ethyl alcohol and (B) 0.01 to 30 parts by weight of a particular surfactant.

[Patent document 1] JP63-69897A
[Patent document 2] JP4-34000A
[Patent document 3] JP2000-8080A
[Patent document 4] JP3-140486A

DISCLOSURE OF THE INVENTION

Problems to be Solved by the Invention

However, in the cleaning agent composite disclosed in the patent document 1, a content of benzyl alcohol is small and hence, the cleaning agent composite exhibits the insufficient cleaning property when used as a cleaning agent for a lead-free solder flux, a high-melting-point solder flux or the like. To be more specific, there arises a drawback that a white residue remains on a polyimide substrate on which solder bumps are formed. On the other hand, the cleaning agent composite contains a relatively large amount of amine group and hence, there arises a drawback that the cleaning agent composite corrodes an epoxy substrate or the like which constitutes an object to be cleaned. Further, it is necessary to add a given amount of surfactant to the cleaning agent composite and hence, when an alcoholic solvent is used, the surfactant is liable to remain on a surface of the substrate in a rinsing step whereby there arises a drawback that the dielectric property is degraded.

Further, the cleaning method of an electronic part disclosed in the patent document 2 uses benzyl alcohol as a single component and hence, there arises a drawback that the cleaning method exhibits the insufficient cleaning property when used as a cleaning agent for a lead-free solder flux, a high-melting-point solder flux or the like. Further, there also arises a drawback that the method exhibits the low rinsing property in a rinsing step which uses an alcoholic solvent.

Further, in the cleaning agent disclosed in the patent document 3, a content of benzyl alcohol is relatively small, while the particular water-soluble glycol ether, the particular surfactant and a given amount of water are added to the cleaning agent and hence, there arises a drawback that the cleaning agent also exhibits the insufficient cleaning property when used as a cleaning agent for a lead-free solder flux, a high-melting-point solder flux or the like and a drawback that the cleaning agent exhibits the low rinsing property in a rinsing step when an alcoholic solvent is used.

Further, the cleaning agent disclosed in the patent document 4 uses benzyl alcohol as a substantially single component in the same manner as the cleaning method of an electronic part disclosed in the patent document 2 and hence, there arises a drawback that the cleaning agent exhibits the insufficient cleaning property when used as a cleaning agent not only for a lead-free solder flux and high-melting-point solder flux but also when used as a cleaning agent for a tin-lead eutectic solder flux.

Accordingly, inventors of the present invention have made an extensive study on the cleaning agents and have found out that by using particular alcohols at a given ratio while taking a content of a glycol compound into consideration, a cleaning agent exhibits the excellent cleaning property in cleaning, for example, the lead-free solder flux containing rosin as a major component, the high-melting-point solder flux and a non-cleaning the solder flux and the like and, at the same time, exhibits the excellent rinsing property in a rinsing step which uses an alcoholic solvent, and have completed the present invention.

That is, it is an object of the present invention to provide a cleaning agent for removing the solder flux and a method for cleaning the solder flux which are suitable for cleaning a lead-free solder flux, a high-melting-point solder flux and the like and exhibit the excellent cleaning property and rinsing property.

Means for Solving the Problems

According to the cleaning agent for removing the solder flux of the present invention, there is provided a cleaning agent for removing the solder flux which sets a content of benzyl alcohol to a value which falls within a range of 70 to 99.9 weight % and a content of amino alcohol to a value which falls within a range of 0.1 to 30 weight % when a content of a glycol compound is below 1 weight % with respect to a total amount of the cleaning agent for removing the solder flux, and sets a content of benzyl alcohol to a value which falls within a range of 15 to 99 weight % and a content of amino alcohol to a value which falls within a range of 0.1 to 30 weight % when a content of the glycol compound falls within a range of 1 to 40 weight % with respect to a total amount of the cleaning agent for removing the solder flux, thus overcoming the above-mentioned drawbacks.

That is, by adopting such a constitution, due to an alkaline action of amino alcohol, the saponification reaction and a permeability are enhanced and, at the same time, an electrical neutralizing ability is enhanced and hence, the cleaning agent can exhibit the excellent cleaning property for a particular flux content, solder fine particles and the like. Further, amino alcohol is liable to easily form a salt by reacting with a particular flux component which exhibits poor polarity such as rosin and hence, solubility property into water-containing alcohol is enhanced thus also exhibiting the excellent rinsing property. Further, the cleaning agent contains a given amount of glycol ether and hence, the cleaning agent exhibits the excellent cleaning property not only for the lead-free solder flux, the high-melting-point solder flux and the like but also for a tin-lead eutectic solder flux.

Further, in constituting the cleaning agent for removing the solder flux of the present invention, when the cleaning agent contains a surfactant, it is preferable to set a content of the surfactant to a value of below 0.1 weight % with respect to a total amount of the cleaning agent for removing the solder flux.

By adopting such a constitution, in the rinsing step which uses an alcoholic solvent, the cleaning agent can exhibit the more excellent rinsing property.

Further, in constituting the cleaning agent for removing the solder flux of the present invention, it is preferable that the glycol compound is glycol ether compound expressed by a following general formula (1).

By adopting such a constitution, the optimization of solubility parameters of the cleaning agent can be easily facilitated and hence, the cleaning agent can exhibit the excellent cleaning property, the rinsing property and the stability of a cleaning solution not only for a lead-free solder flux, a high-melting-point solder flux and the like but also for a tin-lead eutectic solder flux. Further, by adding such glycol ether, it is possible to further reduce a dielectric loss on a surface of a substrate.

(In the general formula (1), $R^1$ is an alkyl group having 1 to 8 carbons and the repetition number n is an integer from 1 to 3.)

Further, in constituting the cleaning agent for removing the solder flux of the present invention, it is preferable that the cleaning agent further includes a phenol-based antioxidant by an amount which falls within a range of 0.01 to 10 weight % with respect to a total amount of the cleaning agent for removing the solder flux.

By adopting such a constitution, it is possible to effectively prevent the degradation of the cleaning agent by oxidation and hence, it is possible to clean an object to be cleaned to which a solder flux is adhered over a long period in a stable manner using the cleaning agent for removing the solder flux.

Further, in constituting the cleaning agent for removing the solder flux of the present invention, it is preferable that a solubility parameter is set to a value which falls within a range of 10 to 15.

By adopting such a constitution, the cleaning agent could clean the lead-free solder flux, the high-melting-point solder flux and the like within a shorter time.

Further, in constituting the cleaning agent for removing the solder flux of the present invention, it is preferable that the electric conductivity is set to a value which falls within a range of 0.5 to 20 µS/cm.

By adopting such a constitution, it is possible to perform a quantitative control of the solder flux and hence, the stable cleaning property can be obtained and, at the same time, the degree of degradation can be determined.

Further, in constituting the cleaning agent for removing the solder flux of the present invention, it is preferable that the difference (tan δ at 97% RH–tan δ at 54% RH) between a dielectric loss measured under an atmosphere of relative humidity of 97% (tan δ at 97% RH) using a JIS 2-type comb-type electrode attached substrate and the dielectric loss measured under the atmosphere of relative humidity of 54% (tan δ at 54% RH) using the JIS 2-type comb-type electrode attached substrate is set to a value which is 0.03 or less.

By adopting such a constitution, it is possible to determine the degree of the degradation of the flux cleaning agent by quantifying a liquid state of not only the flux cleaning agent after cleaning an object to be cleaned but also the flux cleaning agent before cleaning the object to be cleaned. Accordingly, it is possible to accurately evaluate a recycled state of the flux cleaning agent and hence, it is possible to obtain the stable cleaning property.

Further, in constituting the cleaning agent for removing the solder flux of the present invention, it is preferable that an object to be cleaned is a solder flux which is formed of either one of a lead-free solder flux or a high-melting-point solder flux containing rosin as a main component to which at least one compound selected from a group consisting of an organic acid salt, a glycidyl ether compound, an oxyacid compound, a carboxylic acid compound, an anilide compound and a thermosetting resin is added.

By specifying an object of the solder flux, it is possible to obtain the given wettability or the like as the lead-free solder flux or the high-melting-point solder flux and to easily remove the flux.

Further, another aspect of the present invention is directed to a method for cleaning the solder flux which is characterized by including:

a step in which an object to be cleaned to which a solder flux is attached is cleaned using a cleaning agent for removing the solder flux which sets a content of benzyl alcohol to a value which falls within a range of 70 to 99.9 weight % and a content of amino alcohol to a value which falls within a range of 0.1 to 30 weight % when a content of a glycol compound is below 1 weight % with respect to a total amount, and sets a content of benzyl alcohol to a value which falls within a range of 15 to 99 weight % and a content of amino alcohol to a value which falls within a range of 0.1 to 30 weight % when a content of the glycol compound falls within a range of 1 to 40 weight % with respect to a total amount, and a rinsing step which rinses the object to be cleaned using an alcoholic solvent.

That is, by performing such a method, it is possible to obtain the excellent rinsing property even when a content of benzyl alcohol in the cleaning agent is relatively large.

Further, in performing the method for cleaning the solder flux according to the present invention, it is preferable to set the concentration of benzyl alcohol in the rinse solution in the rinsing step to 30 weight % or less.

By performing the cleaning method in this manner, it is possible to effectively prevent the re-adhesion of the flux to a surface of an object to be cleaned in the rinsing step.

Further, in performing the method for cleaning the solder flux according to the present invention, it is preferable that the solder flux is either a lead-free solder flux or a high-melting-point-flux containing rosin as a main component.

By performing the cleaning method in this manner, the solder flux can obtain the given wettability and the like as the lead-free solder flux or the high-melting-point solder flux, and further, the solder flux can be easily removed.

Further, in performing the method for cleaning the solder flux according to the present invention, it is preferable to clean an object to be cleaned to which the solder flux is adhered under conditions of 10 to 90° C. and 0.5 to 30 minutes using a cleaning agent for removing the solder flux.

By performing the cleaning method in this manner, it is possible to obtain a given cleaning property while effectively preventing the degradation of the cleaning agent for removing the solder flux.

BEST MODE FOR CARRYING OUT THE INVENTION

First Embodiment

The first embodiment is directed to a cleaning agent for removing the solder flux which includes 70 to 99.9 weight % of benzyl alcohol and 0.1 to 30 weight % of amino alcohol with respect to the total amount of the cleaning agent when a glycol compound is below 1 weight % with respect to the total amount of the cleaning agent and the cleaning agent includes 15 and 99 weight % of benzyl alcohol and 0.1 to 30 weight % of amino alcohol with respect to the total amount of the cleaning agent in case that the cleaning agent includes 1 to 40 weight % of the glycol compound with respect to the total amount of the cleaning agent.

That is, it is difficult to sufficiently clean a lead-free solder flux, a high-melting-point flux or the like which is adhered to a polyimide substrate or the like within a short time when only benzyl alcohol is used. With the addition of given amino alcohol, however, there is no possibility that the rinsing property is degraded and, rather, the rising property is enhanced. Further, not to mention a usual solder flux, it is also possible to clean and remove the lead-free solder flux, the high-melting-point solder flux or the like sufficiently within a short time.

The constituents and the like of the cleaning agent for removing the solder flux are explained specifically hereinafter.

1. Benzyl Alcohol

With respect to kinds of benzyl alcohol, as described above, the benzyl alcohol may include an alcohol compound having substituent on the benzene ring such as p-methylbenzene alcohol, p-methoxybenzyl alcohol, for example. However, a melting point of benzyl alcohol is a room temperature or less, more specifically −15.3° C., and hence, benzyl alcohol can be easily handled whereby it is preferable to use benzyl alcohol in a single form.

Further, it is preferable to determine a content of benzyl alcohol by taking a content of glycol compound into consideration. To be more specific, when the content of glycol compound is below 1 weight %, the content of benzyl alcohol falls within a range of 70 to 99.9 weight % and the content of amino alcohol falls within a range of 1 to 30 weight %, while when the content of glycol compound falls within a range of 1 to 40 weight %, the content of benzyl alcohol falls within a range of 15 to 99 weight % and the content of the amino alcohol falls within a range of 0.1 to 30 weight %.

The reason is that in case that the content of glycol compound is 1 weight % or less, when the content of benzyl alcohol assumes a value which is below 70 weight %, it becomes difficult to clean a lead-free solder flux, a high-melting-point flux or the like shortly and sufficiently unless a cleaning temperature is set to a high temperature, for example, 50° C. or more. On the other hand, when the content of such benzyl alcohol exceeds 99.9 weight %, there may arise drawbacks that the cleaning property and the rinsing property of the cleaning agent for cleaning and rinsing the lead-free solder flux, high-melting-point solder flux and the like are deteriorated or the cleaning agent infiltrates into a soldered substrates or the like thus changing a weight of the substrate.

Accordingly, when the content of the glycol compound is below 1 weight %, it is more preferable to set the content of benzyl alcohol to a value which falls within a range of 75 to 98 weight % with respect to the total amount of the cleaning agent, and it is still more preferable to set the content of benzyl alcohol to a value which falls within a range of 80 to 95 weight % with respect to the total amount of the cleaning agent.

Further, in case that the content of glycol compound falls within a range of 1 to 40 weight %, when the content of benzyl alcohol assumes a value which is below 15 weight %, it becomes difficult to clean not only a normal solder flux but also a lead-free solder flux, a high-melting-point solder flux or the like in a short time and sufficiently. On the other hand, when the content of the benzyl alcohol exceeds 99.9 weight %, there may arise a drawback that the cleaning property and the rinsing property of the cleaning agent for cleaning and rinsing the lead-free solder flux, high-melting-point solder flux and the like are deteriorated.

Accordingly, when the content of the glycol compound falls within the range of 1 to 40 weight %, it is more preferable to set the content of benzyl alcohol to a value which falls within a range of 30 to 95 weight % with respect to the total amount of the cleaning agent, and it is still more preferable to set the content of benzyl alcohol to a value which falls within a range of 40 to 90 weight % with respect to the total amount of the cleaning agent.

Figure 1:
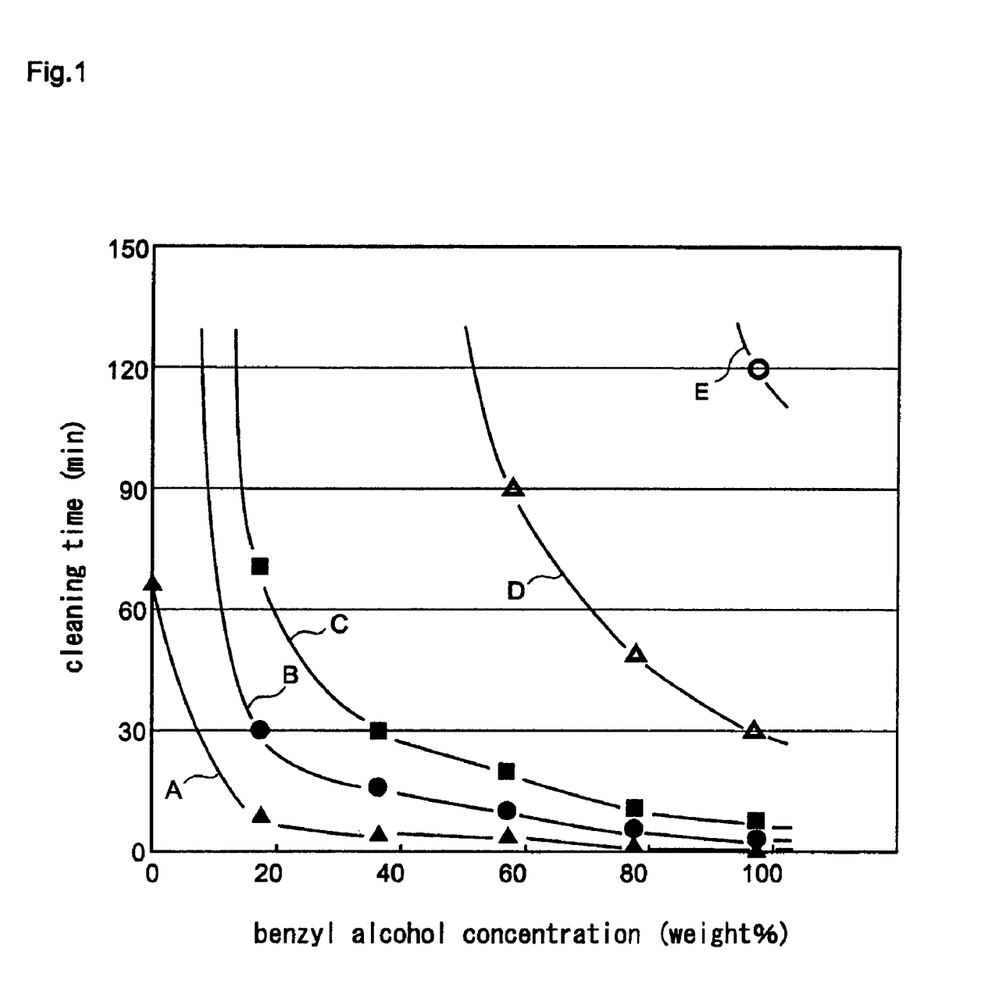
FIG. 1 is a view for explaining the relationship between a content of benzyl alcohol in a cleaning solution and a cleaning time at every cleaning temperature.

Here, the relationship between the content (concentration) of benzyl alcohol in the cleaning agent and a cleaning time at respective cleaning temperatures when the content of glycol compound is changed within a range of 0 to 100 weight % is explained in detail in conjunction with FIG. 1.

In FIG. 1, the content (weight %) of benzyl alcohol in the cleaning agent is taken on an axis of abscissas and the cleaning time (minutes) of the lead-free solder flux at respective cleaning temperatures is taken on an axis of ordinates. Further, in FIG. 1, the line indicated by symbol A corresponds to a case when the temperature of the cleaning agent 70° C. and the lines indicated by symbols B to E similarly correspond to cases when the temperatures of the cleaning agent are set to 60° C., 50° C., 40° C. and 30° C. respectively. As can be easily understood from FIG. 1, the cleaning time of the lead-free solder flux is liable to become shorter corresponding to the elevation of the content of benzyl alcohol and the cleaning temperature.

Accordingly, when the content of glycol compound is equal to or below a given amount, it is possible to clean the lead-free solder flux within 30 minutes at the cleaning temperature of 40° C. by relatively increasing the content of benzyl alcohol, for example, 99.9 weight %. Further, when the content of glycol compound is equal to or more than a given amount, even when the content of benzyl alcohol is relatively small, for example, 40 weight %, it is possible to clean the lead-free solder flux within 30 minutes at a cleaning temperature 50° C.

Here, although the cleaning temperature may be taken into consideration, it is possible to easily control a weight change ratio of a glass epoxy substrate at the time of cleaning to a value of 0.5% or less provided that the cleaning time is within 30 minutes. Accordingly, it has been found out that, by performing the rinsing operation under proper conditions in the rinsing step, benzyl alcohol or the like which is infiltrated into the flux is effectively removed from the glass epoxy substrate and hence, it is possible to approximate the weight change ratio to 0.

Figure 2:
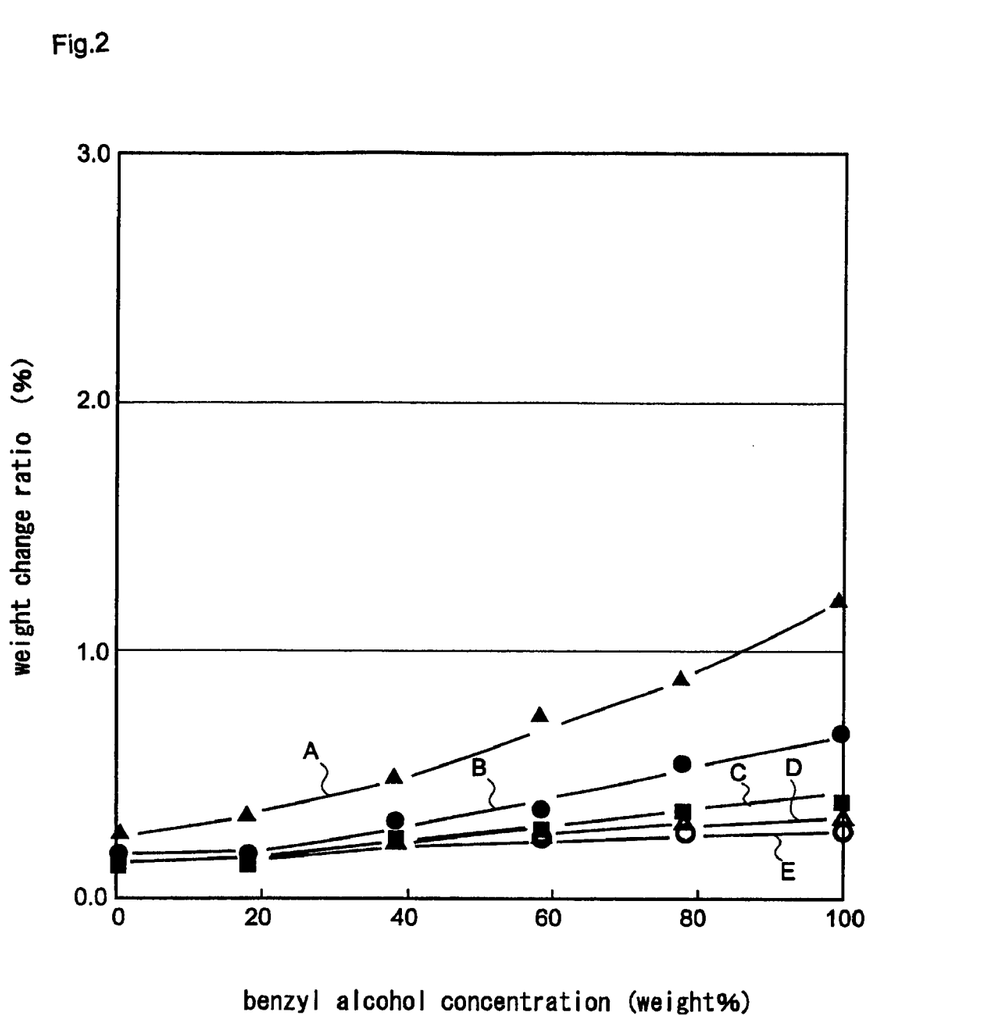
FIG. 2 is a view for explaining the relationship between the content of benzyl alcohol in the cleaning solution and a weight change ratio of a substrate at every cleaning temperature.

Further, the relationship between the content (concentration) of benzyl alcohol and the weight change ratio of the glass epoxy substrate when the content of the glycol compound in the cleaning agent is changed within a range of 0 to 100 weight % is explained in detail in conjunction with FIG. 2.

In FIG. 2, the content (weight %) of benzyl alcohol in the cleaning agent is taken on an axis of abscissas and the weight change ratio (%) of the glass epoxy substrate at respective cleaning temperatures is taken on an axis of ordinates. Further in FIG. 2, a line indicated by symbol A corresponds to a case when the temperature of the cleaning agent is 70° C. and the lines described with symbols B to E similarly correspond to cases when the temperatures of the cleaning agent are set to 60° C., 50° C., 40° C. and 30° C. respectively. As can be easily understood from FIG. 2, the weight change ratio (%) of the glass epoxy substrate is liable to be increased corresponding to the increase of the content of the benzyl alcohol or the rise of the cleaning temperature.

Accordingly, when the content of glycol compound is equal to or below a given amount, by setting the content of benzyl alcohol to a relatively large value, for example, 99.9 weight % while setting the cleaning temperature to 40° C., it is possible to set the weight change ratio of the glass epoxy substrate to a value of 0.5% or less. Further, when the content of glycol compound is equal to or more than a given amount, when the content of benzyl alcohol is relatively small, for example, 40 weight %, it is possible to set the value of weight change ratio of the glass epoxy substrate to a value of 0.5% or less even when the cleaning temperature is 70° C.

Here, provided that the weight change ratio of the glass epoxy substrate in the cleaning time is 0.5% or less, it has been found out that, by performing the rinsing operation under proper conditions in the rinsing step, benzyl alcohol or the like which is infiltrated into the flux is effectively removed from the glass epoxy substrate and hence, it is possible to approximate the weight change ratio to 0.

2. Amino Alcohol (1) Kind

Although a kind of amino alcohol is not particularly limited, it is possible to use a single kind or the combination of multiple kinds of alcohols selected from a group consisting of, for example, diethanol aminetriethanol amine, monoisopropanol amine, diisopropanolamine, triisopropanol amine, N-methyl-monoethanol amine, N-ethyl monoethanol amine, N-butyl mono-ethanol amine, N-methyl diethanol amine, N-ethyl diethanol amine N-buthyl diethanol amine, N-cyclohexyl diethanol amine, N,N-dimethyl monoethanol amine, N,N-diethyl monoethanol amine, N,N-dibutyl monoethanol amine and so on.

Among such amino alcohols described above, diethanol amine, triethanol amine, diisopropanol amine, triisopropanol amine, N-methyl diethanol amine and N-cyclohexyl diethanol amine are preferably used. This is because that these amino alcohols are not only relatively inexpensive but also exhibit the excellent cleaning property at the time of cleaning the lead-free solder flux, the high melting point solder flux or the like even when a relatively small amount of the amino alcohol is added.

(2) Boiling Point

Further, it is also preferable to select a kind of amino alcoholic based on a boiling point thereof. More specifically, it is preferable to select amino alcohol having a boiling point which falls within a range of 120° C. to 400° C. The reason is that when the boiling point of such amino alcohol becomes 120° C. or less, there exists a possibility that the amino alcohol becomes highly flammable and hence, it becomes difficult to handle the obtained cleaning agent for removing the solder flux, or it is necessary to excessively lower the cleaning temperature.

On the other hand, when the boiling point of amino alcohol exceeds 400° C., there exists a possibility that it becomes difficult to clean lead-free solder flux, the high-melting-point solder flux or the like within a short time and sufficiently.

Accordingly, it is more preferable to select amino alcohol having the boiling point which falls within a range of 180 to 370° C.

(3) Content

Further, the present invention is also characterized in that the content of amino alcohol is set to a value which falls within the range of 0.1 to 30 weight % with respect to the total amount of the cleaning agent for removing the solder flux.

The reason is that when the content of such amino alcohol is below 0.1 weight %, there activity of acid substances contained in the lead-free solder flux, the high-melting-point solder flux or the like is lowered and hence, there may arise a drawback that a cleaning property for the lead-free solder flux and the high-melting-point solder flux is remarkably degraded or the rinsing property in a rinsing step which is performed using an alcoholic agent in a next step is degraded.

On the other hand, when the content of the amino alcohol exceeds 30 weight %, to the contrary, there may arise a drawback that the cleaning property for the lead-free solder flux and the high-melting-point solder flux is lowered or the cleaning agent erodes a substrate for electronic components to which objects to be cleaned are adhered.

Accordingly, it is more preferable to set the content of the amino alcohol to a value which falls within a range of 1 to 20 weight %, or it is still more preferable to set the content of the amino alcohol to a value which falls within a range of 3 to 10 weight % with respect to the total amount.

3. Glycol Compound (1)-1 Kind

It is preferable to add glycol compound to the cleaning agent for removing the solder flux. As kinds of glycol compound, for example, a glycol ether compound represented by following formulae (1) to (4) or a glycol ester compound which is formed of the glycol ether compound and acetic acid or propionic acid is preferably used.

The reason is that by adding such glycol ether compound or the like to the cleaning agent for removing the solder flux, it is possible to sufficiently remove not only the lead-free solder flux and the high-melting-point solder flux but also the normal solder flux in a short time.

(1)

(In the general formula (1), $R^1$ is an alkyl group having 1 to 8 carbons and the repetition number n is an integer from 1 to 3.)

(2)

(In the general formula (2), $R^2$ is an alkyl group having 1 to 6 carbons and $R^3$ is a hydrogen or a methyl group.)

(3)

(In the general formula (3), $R^4$ is an alkyl group having 1 to 6 carbons, $R^5$ is a hydrogen or a methyl group, and $R^6$ is an alkyl group having 1 to 2 carbons.)

(4)

(In the general formula (4), $R^7$ is a methyl group, $R^8$ is a hydrogen or a methyl group, and $R^9$ is a methyl group.)

To be more specific, a single kind or the combination of multiple kinds of the followings can be named: diethylene glycol mono-methyl ether, diethylene glycol monoethyl ether, diethylene-glycol monopropyl ether, diethylene glycol monobutyl ether, di-ethylene glycol monohexyl ether, diethylene glycol monooctyl ether, triethylene glycol monomethyl ether, triethylene glycol monoethyl ether, triethylene glycol monopropyl ether, triethylene glycol monobutyl ether, triethylene glycol monohexyl ether, triethylene glycol monooctyl ether, propylene glycol monomethyl ether, propylene glycol monoethyl ether, propylene glycol monopropyl ether, propylene glycol monobutyl ether, propylene glycol monohexyl ether, propylene glycol monooctyl ether, dipropylene glycol monomethyl ether, dipropyelene glycol monoethyl ether, dipropylene glycol monopropyl ether, dipropylene glycol monobutyl ether, dipropylene glycol monohexyl ether, dipropylene glycol monooctyl ether, tripropylene glycol monomethyl ether, tri-propylene glycol monoethyl ether, tripropylene glycol mono-propyl ether, tripropylene glycol monobutyl ether, tri-propylene glycol monohexyl ether, tripropylene glycol mono-octyl ether, diethylene glycol dimethyl ether, diethylene glycol diethyl ether, diethylene glycol dipropyl ether, diethylene glycol dibutyl ether, diethylene glycol dihexyl ether, diethylene glycol dioctyl ether, triethylene glycol dimethyl ether, triethylene glycol diethyl ether, triethylene glycol dipropyl ether, triethylene glycol dibutyl ether, triethylene glycol dihexyl ether, triethylene glycol dioctyl ether, propylene glycol dimethyl ether, propylene glycol diethyl ether, propylene glycol dipropyl ether, propylene glycol dibutyl ether, propylene glycol dihexyl ether, propylene glycol dioctyl ether, dipropylene glycol dimethyl ether, dipropylene glycol diethyl ether, dipropylene glycol dipropyl ether, dipropylene glycol dibutyl ether, dipropylene glycol dihexyl ether, dipropylene glycol dioctyl ether, tripropylene glycol dimethyl ether, tripropylene glycol diethyl ether, tripropylene glycol dipropyl ether, tripropylene glycol dibutyl ether, tripropylene glycol dihexyl ether, tripropylene glycol dioctyl ether and the like.

(1)-2 Contents

Further, it is preferable that the content of the glycol compound is set by taking the kinds of the object to be cleaned into consideration. When the content of benzyl alcohol is set within a rather wide range, to be more specific, within a range of 70 to 99.9 weight % so as to include not only the lead-free solder flux or the high-melting-point solder flux but also a normal tin-lead eutectic solder flux in the object to be cleaned, according to the present invention, the content of the glycol compound is set to a value which falls within a range 1 to below 40 weight %.

The reason is that when the content of glycol ether is set to a value of below 1 weight %, there is a possibility that the cleaning property for the tin-lead eutectic solder flux is remarkably degraded. On the other hand, when the content of the glycol ether exceeds 40 weight %, there exists a possibility that the cleaning property for the lead-free solder flux, the high-melting-point solder flux and the like is remarkably degraded.

Accordingly, it is preferable to set the content of amino alcohol to a value which falls within a range of 1 to 20 weight %, and more specifically, to a value which falls within a range of 3 to 10 weight %.

Further, when the object to be cleaned is either the lead-free solder flux, the high-melting-point solder flux or the like, more specifically, when the content of benzyl alcohol is set to a value which falls within a range of 70 to 99.9 weight % and the content of amino alcohol is set to a value which falls within a range of 0.1 to 30 weight %, it is preferable to set the content of the glycol compound to a value of below 1 weight %.

The reason is that when the content of such glycol ether assumes a value of 1 weight % or more, there exists a possibility that the cleaning property for the lead-free solder flux, the high-melting-point solder flux and the like is remarkably degraded.

4. Antioxidants

Further, although it is preferable to add various kinds of antioxidants to the cleaning agent for removing the solder flux, it is preferable to use a phenol-based antioxidant.

The reason is that provided that the phenol antioxidant is used as the cleaning agent for removing the solder flux, even when the cleaning agent for removing the solder flux is used for a long period while being heated at a high temperature, a given oxidation prevention effect is achieved and, at the same time, coloring staining by decomposition is small.

As specific examples of preferable phenol antioxidants, a single kind or the combination of multiple kinds of the following agents can be named: octadecyl-3-(3,5-di-t-butyl-4-hydroxyphenyl)propionate, pentaerythrytyl-tetrakis[3-(3,5-di-t-butyl-4-hydroxyphenyl) propionate, triethylene glycol-bis[3-(3-t-butyl-5-methyl-4-hydroxyphenyl)propionate, 1,6-hexane diol-bis[3-(3,5-di-t-butyl-4-hydroxyphenyl) propionate], bis[2-methyl-4-(3-n-alkyltiopropionyloxy)-5-t-butylphenyl) sulfide], 2,6-di-t-butyl-4-methylphenol, tetrakis (methylene-1-3-(3',5'-di-t-butyl-4'-hydroxyphenyl) propionate]methane and so on.

Further, the present invention is characterized in that the content of the antioxidant is set to a value which falls within a range of 0.01 to 10 weight % with respect to the total amount of the cleaning agent for removing the solder flux.

The reason is that when the content of such antioxidant is set to a value of below 0.01 weight %, there exists a possibility that the oxidation of the cleaning agent cannot be prevented. On the other hand, when the content of the antioxidant exceeds 10 weight %, there exists a possibility that the cleaning property for the lead-free solder flux, the high-melting-point solder flux or the like is remarkably degraded.

Accordingly, it is preferable to set the content of antioxidant to a value which falls within a range of 0.05 to 3 weight % with respect to the total amount of the cleaning agent for removing the solder flux, and it is more preferable that the value falls within a range of 0.1 to 1 weight % with respect to the total amount of the cleaning agent for removing the solder flux.

5. Solubility Parameter

Further, it is preferable to set the solubility parameter of the cleaning agent for removing the solder flux to a value which falls within a range of 10 to 15.

The reason is that when the solubility parameter exceeds the above-described range, there exists a possibility that the cleaning property for the lead-free solder flux, the high-melting-point solder flux or the like is remarkably degraded.

Accordingly, it is more preferable to set the solubility parameter of the cleaning agent for removing the solder flux to a value which falls within a range of 11 to 14 with respect to the total amount of the cleaning agent for removing the solder flux.

6. Electric Conductivity

Still further, it is preferable to set the electric conductivity (at a room temperature) of the cleaning agent for removing the solder flux to a value which falls within a range of 0.5 to 20 µS/cm.

The reason is that when the electric conductivity is set to a value of below 0.5 µS/cm, there exists a possibility that the cleaning property for the lead-free solder flux, the high-melting-point solder flux or the like is remarkably degraded. On the other hand, when the electric conductivity exceeds 20 µS/cm, there exists a possibility that the cleaning agent for removing the solder flux erodes a substrate for electronic components to which objects to be cleaned and mounted.

Accordingly, it is preferable to set the electric conductivity of the cleaning agent for removing the solder flux to a value which falls within a range of 0.7 to 10 µS/cm and it is more preferable to set the electric conductivity of the cleaning agent for removing the solder flux to a value which falls within a range of 0.9 to 3 µS/cm.

7. Dielectric Loss

Further, it is preferable to limit the dielectric loss measured by using a JIS-2-type comb-type electrode-attached substrate to a value which falls within a given range. That is, it is preferable to set the difference (tan δ at 97% RH−tan δ at 54% RH) between the electric loss (tan δ at 97% RH) measured in an atmosphere having a relative humidity of 97% and the electric loss (tan δ at 54% RH) measured in an atmosphere having a relative humidity of 54% using the JIS 2 type comb-type electrode-attached substrate to a value of 0.03 or less.

The reason is that when the difference of the electric loss exceeds 0.03, there exists a possibility that a circuit characteristic of the substrate is changed thus generating the migration.

Accordingly, it is further preferable to control the difference of the electric loss to a value of 0.02 or less.

8. Object to be Cleaned

As for the kinds of the objects to be cleaned, not only soldered electronic components or products, but also components or the like which are affected by fluxes can be suitably used as objects to be cleaned even when the solder treatment is not applied to the components. Accordingly, although the kinds of the objects to be cleaned are not particularly limited, a printed circuit board, a ceramic wiring board, a semiconductor device (including semiconductor components such as BGA, CSP, PGA, LGA and the like), a semiconductor-element mounting substrate, a bump-attached TAB tape, a no-bump-attached TAB tape, a semiconductor element mounting TAB tape, a lead frame, a capacitor, a resistor and the like are specifically named, for example.

Further, among these soldered electronic components and products, the kinds of the solder flux to be used are not particularly limited. However, it is preferable to adopt a lead-free solder flux, a high-melting-point solder flux, or a solder flux without cleaning. That is, these solder fluxes usually contain rosin as their main components and, in many cases, at least one kind of compound such as an organic acid salt, a glycidyl ether compound, an oxyacid compound, a carbonoxylic acid compound (including dicarbon acid compound), an anilide compound and a thermosetting resin (for example, an epoxy resin or a thermosetting acrylic resin) is added to the solder flux. Accordingly, the cleaning agent for removing the solder flux according to the present invention performs an excellent cleaning property not only with respect to a normal solder flux but also selectively with respect to these solder fluxes.

Further, since rosin exhibits the favorable solubility to benzyl alcohol and amino alcohol, it is preferable to adopt a compound in which a portion of the whole rosin is hydrogenerated as a direct object to be cleaned in cleaning the solder flux.

Still further, even when the flux is a normal solder flux without cleaning, when it is necessary to obtain the high electrolytic corrosion resistance, the solder flux may be used as an object to be cleaned at the time of cleaning the solder flux.

Here, although the kinds of the high-melting-point solder, the lead-free solder, and the non-cleaning solder to which the direct object flux is added are not particularly limited, wherein Sn—Ag type, Sn—Ag—Cu type, Sn—Cu type, Sn—Zn type, Sn—Bi type, Pb—Sn type and the like are representatively named.

Second Embodiment

The second embodiment is directed to a method for cleaning a solder flux which includes a step in which an object to be cleaned to which a solder flux is attached is cleaned using a cleaning agent for removing the solder flux which sets a content of benzyl alcohol to a value which falls within a range of 70 to 99.9 weight % and a content of amino alcohol to a value which falls within a range of 0.1 to 30 weight % when a content of a glycol compound is below 1 weight % with respect to a total amount of the cleaning agent for removing the solder flux, and sets a content of benzyl alcohol to a value which falls within a range of 15 to 99 weight % and a content of amino alcohol to a value which falls within a range of 0.1 to 30 weight % when a content of the glycol compound falls within a range of 1 to 40 weight % with respect to the total amount of the cleaning agent for removing the solder flux; and a rinsing step which rinses the object to be cleaned using an alcoholic solvent.

1. Adjustment Process

Prior to the cleaning of the object to be cleaned, it is preferable to provide a step in which benzyl alcohol, amino alcohol or a third component or the like are respectively weighed and added into a container as blending materials and are uniformly mixed so as to adjust the cleaning agent for removing the solder flux.

Here, although the contents of the cleaning agent for removing the solder flux are equal to the contents of the cleaning agent for removing the solder flux of the first embodiment, it is preferable to confirm in this step that the cleaning agent for removing the solder flux has the uniform properties by measuring at least one of the viscosity, the dielectric loss, the acid value, the electric conductivity and the like of the cleaning agent for removing the solder flux and by respectively limiting these contents to values which fall within respective given ranges.

2. Cleaning Step

In this step, the soldered electronic components or products are cleaned using the adjusted cleaning agent for removing the solder flux so as to remove the lead-free solder flux, the high-melting-point solder flux or the like which are adhered to the soldered electronic components or products.

Figure 3:
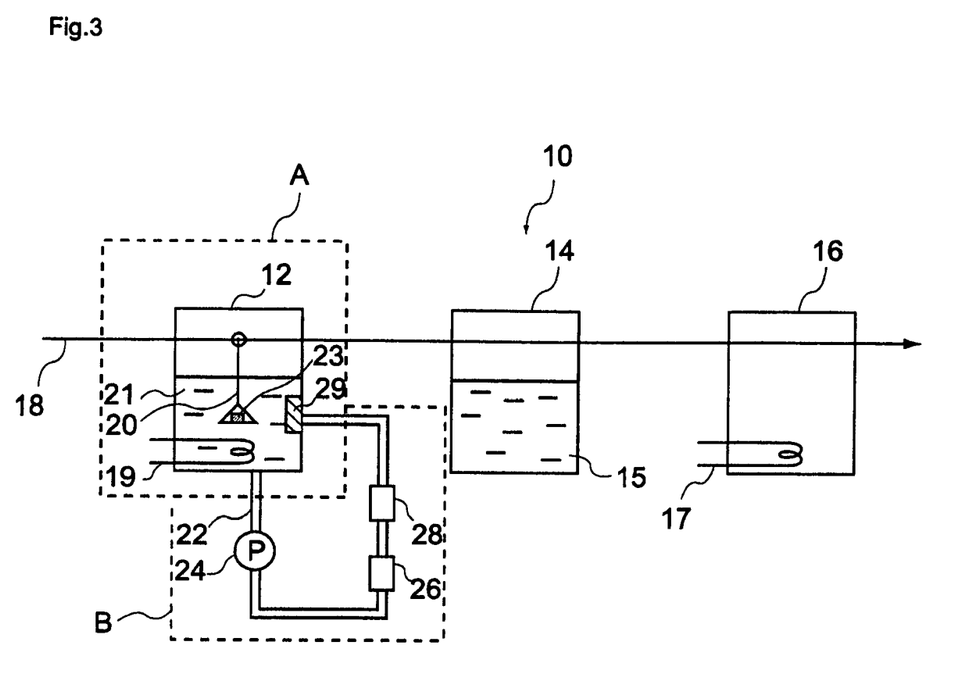
FIG. 3 is a view for explaining a cleaning device.

Here, as shown in FIG. 3, it is preferable to use a cleaning device 10 which includes a washing tank 12 having an ultrasonic vibrator 29 for ultrasonic cleaning, a circulation passage 22, a liquid feed pump 24, a rinsing tank 14, and a drying tank 16.

To be more specific, it is preferable that the washing tank 12 is constituted of a housing portion 20 for an object 23 to be cleaned, the ultrasonic vibrator 29, an agitating device for a cleaning solution (not shown in the drawing), a heater 19 having a thermostat, the circulation passage 22 for circulating a cleaning solution 21, wherein the ultrasonic vibration is applied to the cleaning solution 21 which is agitated and circulated so as to effectively clean the object to be cleaned 23. Next, in the rinsing tank 14, it is preferable that the lead-free solder flux or the high-melting-point solder flux or the like is further removed from the object to be cleaned 23 and, thereafter, the cleaning solution 21 is removed. Still further in the drying tank 16, it is preferable to completely remove the rinse solution 15 or the like by evaporating the rinse solution.

Further, in cleaning to object to be cleaned to which the solder flux is adhered, it is preferable to clean the object to be cleaned under the condition of a temperature which falls within a range of 10 to 90° C. for 0.5 to 30 minutes.

The reason is that it is possible to effectively prevent deterioration of the cleaning agent for removing the solder flux provided that a given cleaning property is obtained under such conditions.

3. Rinsing Step

In this step, the cleaned electronic parts or products are further treated in the rinsing manipulation. Here, it is preferable to use an alcohol-based solvent as the rinse solution because the alcohol-based solvent can quickly dry the electronic parts or products compared to water and also can sufficiently remove benzyl alcohol and amino alcohol.

To be more specific, it is preferable to use a single kind or the combination of multiple kinds of alcohol solvents including methyl alcohol, ethyl alcohol, propyl alcohol, isopropyl alcohol, butyl alcohol, isobutyl alcohol, t-butyl alcohol, s-butyl alcohol, amyl alcohol, 1-methoxy-2-propanol and the like.

Further, it is preferable to use an alcoholic solvent which is produced by adding a given amount of water to such alcohol. To be more specific, it is preferable to use an alcoholic solvent to which water is added such that the water amounts 40 to 70 weight % with respect to the total amount of the alcoholic solvent.

Further, it is preferable to set the rinsing conditions such that the rinsing manipulation is performed at a temperature which falls within a range of 10 to 40° C. for a time which falls within a range of 1 to 30 minutes. It is further preferable that the rinsing manipulation is performed in two stages. The reason is that such rinsing manipulation can also reduce residues of benzyl alcohol and amino alcohol.

Here, after the rinsing step is finished, it is preferable to perform the hot-air drying at a temperature of 40 to 100° C. for 1 to 30 minutes, for example.

Further, when the total amount of the rinse solution which contains industrial ethanol as main component in a rinsing step is set to 100 weight %, it is preferable to set the concentration of benzyl alcohol which is attributed to the cleaning solution in the rinse solution to a 30 weight % or less.

Figure 4:
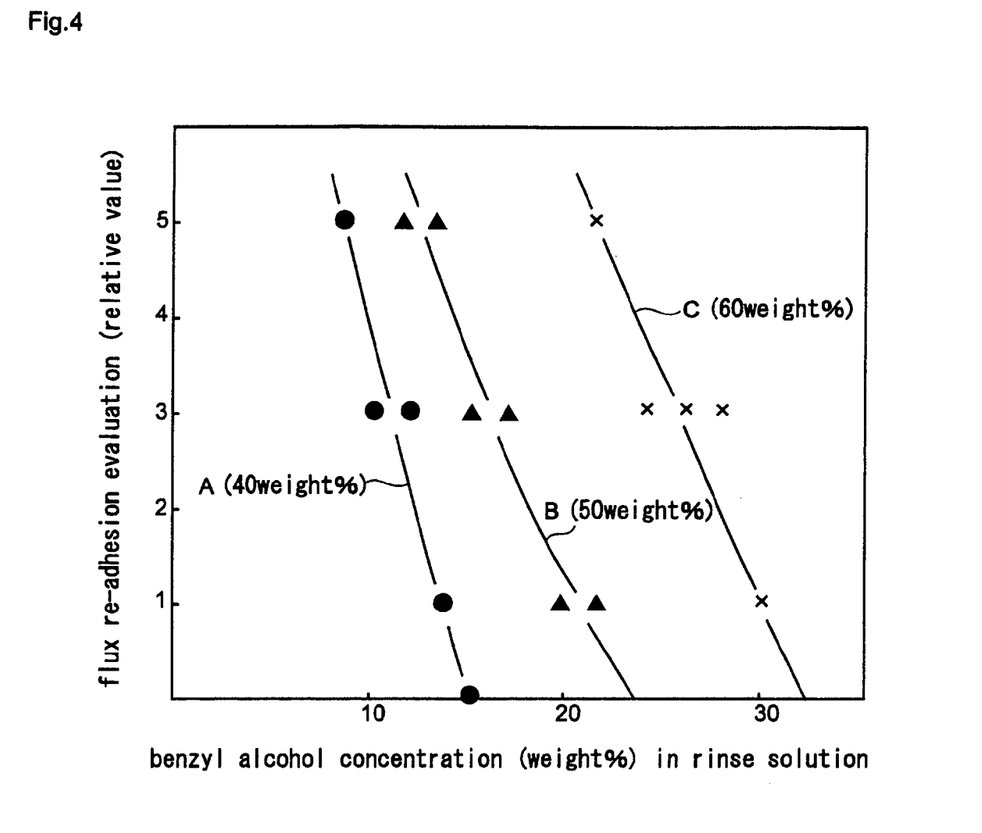
FIG. 4 is a view for explaining the relationship between the concentration of benzyl alcohol in a rinse solution and the re-adhesion property of a flux.

The reason is that, as shown in FIG. 4, when the concentration of benzyl alcohol exceeds 30 weight %, although it may be influenced by the concentration of the rinse solution in the rinsing step, there exists a possibility that the re-adhesion phenomenon of the flux prominently arises in the rinsing step.

Accordingly, even when the concentration of industrial ethanol in the rinse solution used in the rinsing step falls nearly to 50 weight %, it is possible to effectively prevent the re-adhesion phenomenon of the flux and hence, it is further preferable to set the concentration of benzyl alcohol which is attributed to the cleaning solution in the rinse solution to 22 weight % or less. Further, even when the concentration of industrial ethanol in the rinse solution used in the rinsing step falls nearly to 40 weight %, it is possible to effectively prevent the re-adhesion phenomenon of the flux and hence, it is further preferable to set the concentration of benzyl alcohol which is attributed to the cleaning solution in the rinse solution to 14 weight % or less.

Here, in FIG. 4, the concentration (weight %) of benzyl alcohol in the rinse solution is taken on an axis of abscissas and the re-adhesion evaluation (relative value) of the flux in the rinsing step is taken on an axis of ordinates. Further, the lines A to C in FIG. 4 respectively correspond to the cases in which the concentration of industrial ethanol in the rinse solution is set to 40 weight %, 50 weight %, and 60 weight % respectively. Further, in the re-adhesion evaluation of the flux expressed by the lines A to C, the rinsing operation is performed for 10 minutes twice according to the embodiment 1, wherein the relative evaluation is performed such that 5 points are given when the re-adhesion is not recognized at all, 3 points are given when the re-adhesion is hardly recognized, 1 point is given when a small amount of re-adhesion is recognized, and 0 point is given when the re-adhesion is apparently recognized.

EXAMPLES

The present invention is explained in detail hereinafter in conjunction with examples. However, it is needless to say that the scope of the present invention is not limited by the descriptions made hereinafter.

Example 1

1. Adjustment and Evaluation of Cleaning Agent (1) Electric Conductivity

The cleaning agents having the compositions of an example 1 shown in Table 1 are adjusted and are measured using an electric conductivity measuring instrument MODEL SC82 (produced by Yokogawa Electric Corp.) under the condition of a temperature of 25° C.

(2) Cleaning Property Evaluation

Firstly, a solder paste LF Solder TLF-204-85 (produced by Tamura Kaken Co. Ltd.) is printed in a given pattern at a given position of a glass epoxy substrate using a metal mask and the solder paste is made to reflow in a hot plate having a cover at a temperature of 250° C. thus forming a test piece. Then, the test piece is immersed in a beaker of 300 ml which is maintained at a temperature of 70° C. and contains 200 g of cleaning agent therein, wherein the cleaning is performed while agitating the cleaning agent using a magnet stirrer. After cleaning the test piece for a given time, the test piece is taken out from the beaker. Then, the test piece is immersed in another beaker which is filled with 200 g of an aqueous solution containing 55 weight % of industrial-use ethanol as a rinse solution and, thereafter, a rinsing manipulation is performed for 10 minutes while placing the aqueous solution in an agitated state using a magnet stirrer. After performing the rinsing manipulation twice in total, using an oven which is held at a temperature of 80° C., the test piece is dried for ten minutes. Next, the dried test pieces are observed using a stereomicroscope (magnification: 20) and the cleaning property is evaluated based on following criteria. Here, with respect to all of the cleaning agents shown in table 1, 0.1 weight % of phenol-based antioxidant Sumilizer BHT (produced by Sumitomo Chemical Co., Ltd.) with respect to a total amount is added.

E: (excellent): No residue is present after cleaning for three minutes.

G: (good): No residue is present after cleaning for five minutes.

F: (fair): A slight amount of residue remains after cleaning for five minutes.

B: (bad) A large amount of residue remains after cleaning for five minutes.

(3) Dielectric Loss (tan δ)

A solder paste (LF solder TLF-204-85, produced by Tamura Kaken Co., Ltd.) is printed on a given portion of a JIS 2 type comb-shaped electrode attached substrate, the solder paste is made to reflow in a hot plate having a cover at a temperature of 250° C. thus forming a test piece. The test pieces are immersed in the inside of a beaker of 300 ml in which 200 g of cleaning agent is filled and is held at a temperature of 70° C. While agitating the cleaning agent using a magnet stirrer, the cleaning of the test piece is performed for five minutes. Next, the test pieces taken out from the beaker and is immersed in another beaker which is filled with 200 g of aqueous solution containing 55 weight % of industrial-use ethanol as a rinse solution and, rinsing is performed for ten minutes while placing the aqueous solution in an agitated state using the magnet stirrer. The rinsing manipulation is performed twice and, thereafter, the test piece is dried for ten minutes using an oven held at a temperature of 80° C. Next, the dielectric loss of the dried test piece is measured as follows using a precision LCR meter (produced by Yokogawa Hewlett Packard Co. Ltd.). That is, the dielectric loss under an atmosphere of relative humidity 97% RH (tan δ 97% RH) is measured and, at the same time, the dielectric loss under the atmosphere of relative humidity 54% RH (tan δ 54% RH) is further measured, and the difference (tan δ 97% RH−tan δ 54% RH) is calculated. In table 1, the difference is indicated as (tan δ)

(4) Evaluation of Rinsing Property

A flux is added to a 300 ml of a cleaning solution in a beaker such that the flux concentration becomes 5 weight % and a prepared specimen glass is immersed in the cleaning solution. Next, the prepared specimen glass is immersed in another beaker which is filled with 200 g of aqueous solution containing 55 weight % of industrial-use ethanol as a rinse solution and, rinsing is performed for ten minutes while placing the aqueous solution in an agitated state using a magnet stirrer. After performing the rinsing manipulation twice in total, using an oven which is held at a temperature of 80° C., the prepared specimen glass is dried for ten minutes. Next, the dried prepared specimen glass is observed using a stereomicroscope (magnification: 20) and the rinsing property is evaluated based on following criteria by observing a state of the rinse solution.

E: (excellent): The adhesion of the flux to the prepared specimen glass is not observed and the rinse solution is held transparent in the same manner as an initial state.

G: (good): Although the adhesion of the flux to the prepared specimen glass is not observed, some impurities are generated in the rinse solution.

F: (fair): The re-adhesion of a slight amount of flux to the prepared specimen glass is observed.

B: (bad) The re-adhesion of a large amount of flux to the prepared specimen glass is observed.

Examples 2 to 6

In the examples 2 to 6, cleaning agents having the compositions shown in Table 1 are respectively prepared by changing the blending ratio of benzyl alcohol or amino alcohol, by changing a kind of amino alcohol or by adding glycol ether, and the electric conductivity, the cleaning property, the dielectric loss (tan δ) and the rinsing property are respectively measured and evaluated in the same manner as the example 1.

Comparison Examples 1 to 7

In the comparison examples 1 to 7, cleaning agents having the compositions shown in Table 1 are respectively prepared by changing the blending ratio of benzyl alcohol or amino alcohol such that the blending ratio falls outside the range of the present invention or without using amino alcohol, and the electric conductivity, the cleaning property, the dielectric loss (tan δ) and the rinsing property are respectively measured and evaluated in the same manner as the example 1.

As a result, in the comparison example 1, since only benzyl alcohol is used and a given amount of amino alcohol is not added, the value of the electric conductivity is low and hence, there is observed a drawback that the cleaning property and the rinsing property are defective or insufficient correspondingly.

Further, although both of benzyl alcohol and amino alcohol are used together in the comparison example 2, since the amount of benzyl alcohol used in the comparison example 2 is excessively small and hence, there is observed a drawback that the cleaning property is defective although the value of the electric conductivity is relatively high.

Further, in the comparison example 3, since the diethylene glycol monobutyl ether is used together with benzyl alcohol in place of amino alcohol, there is observed a drawback that the value of the electric conductivity is low and hence, the cleaning property is defective correspondingly.

Further, in the comparison example 4, since the polyoxyethylene sorbitan oleate (HLB=10) is used together with benzyl alcohol in place of amino alcohol, there is observed a drawback that the value of the electric conductivity is low and hence, the cleaning property is defective correspondingly.

Further, although benzyl alcohol, amino alcohol and a surfactant are used together in the comparison example 5, since the amount of benzyl alcohol used in the comparison example 5 is excessively small and hence, there is observed a drawback that the cleaning property is defective although the value of the electric conductivity is relatively high.

Further, although benzyl alcohol, glycol ether, polyoxyethylene oleyl ester (HLB=14) and water are used together in the comparison example 6, a amount of benzyl alcohol used in the example 6 is excessively small and, at the same time, a given amount of amino alcohol is not added, there is observed a drawback that the cleaning property is defective.

Further, in the comparison example 7, although glycol ether, triethanol amine are used together, benzyl alcohol is not used and hence, there is observed a drawback that the cleaning property is insufficient.

TABLE 1

| Composition | Example 1 | Example 2 | Example 3 | Example 4 | Example 5 | Example 6 | Comparison Example 1 | Comparison Example 2 | Comparison Example 3 | Comparison Example 4 | Comparison Example 5 | Comparison Example 6 | Comparison Example 7 |
|---|---|---|---|---|---|---|---|---|---|---|---|---|---|
| Benzyl alcohol | 85 | 99 | 70 | 70 | 95 | 97 | 100 | 60 | 80 | 90 | 50 | 55 | |
| A-1 | | | | | 5 | | | | | | | | |
| A-2 | | | | | | 3 | | | | | | | |
| A-3 | 15 | 1 | 5 | 5 | | | | 40 | | | 40 | | 20 |
| B-1 | | | | 25 | | | | | | | | | |
| B-2 | | | 25 | | | | | | 20 | | | 30 | 80 |
| C-1 | | | | | | | | | | | 5 | | |
| C-2 | | | | | | | | | | 10 | | | |
| C-3 | | | | | | | | | | | 10 | | |
| Water | | | | | | | | | | | | 10 | |
| Electric Conductivity (μs/cm) | 2.0 | 1.5 | 1.6 | 0.9 | 1.9 | 1.7 | 0.1 | 2.2 | 0.1 | 0.1 | 210 | 4.7 | 0.7 |
| Cleaning property | E | E | G | G | E | B | B | B | B | B | B | B | F |
| Dielectric Loss(tanδ) | 0.01 | 0.02 | 0.02 | 0.01 | 0.01 | 0.01 | 0.05 | 0.1 | 0.07 | 0.09 | 0.2 | 0.2 | 0.03 |
| Rinsing Property | E | G | E | E | E | E | F | E | G | G | E | G | E |

A-1: diethanol amine
A-2: 2,2'-(cyclohexyl imino)bis-ethanol
A-3: triethanol amine
B-1: dipropylene glycol monobutyl ether
B-2: diethylene glycol monobutyl ether
C-1: polyoxyethylene oleil ester (HLB = 14)
C-2: polyoxyethylene sorbitan oleate (HLB = 10)
C-3: alkylcarboxy betaine type amphoteric surfactant
E: Excellent
G: Good
F: Fair
B: Bad

INDUSTRIAL APPLICABILITY

According to the cleaning agent for removing the solder flux and the cleaning method which uses the cleaning agent for removing the solder flux of the present invention, by allowing the cleaning agent to contain the given quantities of benzyl alcohol and amino alcohol corresponding to the content of the glycol compound, even at the time of cleaning the lead-free soldering flux, the high-melting-point soldering flux or the like, the cleaning agent for removing the solder flux exhibits the excellent cleaning property and, at the same time, exhibits the excellent rinsing property in the rinsing using the alcoholic solvent in the next step. Accordingly, with respect to the soldering the substrate which requires the cleaning of the electric components such as vehicle-mounted substrate or the like which is required to satisfy the high reliability or the high frequency printed circuit board or the like which is required to satisfy the high circuit characteristics, although the lead-free solder and the high-melting point solder are not used since these solders contain particular fluxes and are practically difficult to clean conventionally, it is possible to easily use the lead-free solder and the high-melting point solder according to the cleaning agent for removing the solder flux and the cleaning method which uses the cleaning agent for removing the solder flux of the present invention.

What we claim is:

1. A cleaning agent for removing the solder flux which does not substantially contain water
   wherein a content of benzyl alcohol is set to a value which falls within a range of 70 to 99.9 weight % and a content of amino alcohol is set to a value which falls within a range of 0.1 to 30 weight % when a content of a glycol compound is below 1 weight % with respect to a total amount of the cleaning agent for removing the solder flux,
   and a content of benzyl alcohol is set to a value which falls within a range of 15 to 99 weight % and a content of amino alcohol is set to a value which falls within a range of 0.1 to 30 weight % when a content of the glycol compound falls within a range of 1 to 40 weight % with respect to a total amount of the cleaning agent for removing the solder flux.

2. The cleaning agent for removing the solder flux according to claim 1, wherein when the cleaning agent for removing the solder flux contains a surfactant, a content of the surfactant is set to a value of below 0.1 weight % with respect to the total amount of the cleaning agent for removing the solder flux.

3. The cleaning agent for removing the solder flux according to claim 1, wherein the glycol compound is glycol ether compound expressed by a following general formula (1):

(In the general formula (1), $R^1$ is an alkyl group having 1 to 8 carbons and the repetition number n is an integer from 1 to 3).

4. The cleaning agent for removing the solder flux according claim 1, wherein the cleaning agent further includes a phenol-based antioxidant by an amount which falls within a range of 0.01 to 10 weight % with respect to a total amount of the cleaning agent for removing the solder flux.

5. The cleaning agent for removing the solder flux according to claim 1, wherein a solubility parameter is set to a value which falls within a range of 10 to 15.

6. The cleaning agent for removing the solder flux according to claim 1, wherein the electric conductivity is set to a value which falls within a range of 0.5 to 20 μS/cm.

7. The cleaning agent for removing the solder flux according to claim 1, wherein the difference (tan δ at 97% RH–tan δ at 54% RH) between a dielectric loss measured under an atmosphere of relative humidity of 97% (tan δ at 97% RH) using a JIS 2-type comb-type electrode attached substrate and the dielectric loss measured under the atmosphere of relative humidity of 54% (tan δ at 54% RH) using the JIS 2-type comb-type electrode attached substrate is set to a value which is 0.03 or less.

8. The cleaning agent for removing the solder flux according to claim 1, wherein an object to be cleaned is a solder flux which is formed of either one of a lead-free solder flux or a high-melting-point solder flux containing rosin as a main component to which at least one compound selected from a group consisting of an organic acid salt, a glycidyl ether compound, an oxyacid compound, a carboxylic acid compound, an anilide compound and a thermosetting resin is added.

* * * * *